United States Patent [19]

Avinash

[11] Patent Number: 5,943,433
[45] Date of Patent: Aug. 24, 1999

[54] METHOD FOR CORRECTING INHOMOGENEITY OF SPATIAL INTENSITY IN AN AQUIRED MR IMAGE

[75] Inventor: Gopal B. Avinash, New Berlin, Wis.

[73] Assignee: General Electric Company, Milwaukee, Wis.

[21] Appl. No.: 08/782,025

[22] Filed: Dec. 30, 1996

[51] Int. Cl.$^6$ .............................. G06K 9/00; G06K 9/40; G01V 3/00
[52] U.S. Cl. .......................... 382/131; 382/275; 324/307; 324/309; 600/410
[58] Field of Search ............................ 600/410; 324/307, 324/309, 312; 382/131, 132, 264, 274, 275, 299, 154; 25/455

[56] References Cited

U.S. PATENT DOCUMENTS 4,823,085   4/1989   Fuderer et al. .......................... 324/309

OTHER PUBLICATIONS

"The Image Processing Handbook", John C. Russ, 2nd edition, CRC Press 1995, p. 271.
Murakami, James W., Hayes, Cecil E., Weinberger, Ed. "Intensity Correction of Phased–Array Surface Coil Images." MRM 35:585–590 (1996).
C.R. Meyer,P.H. Bland, J.Pipe (1995) RetrospectiveCorrection of Intensity Inhomogeneities in MRI. Transactions on Medical Imaginh, vol. 14, No. 1, Mar. 1995.
S.E. Moyher, D.B. Vigeron, S.J. Nelson (1995) Surface coil MR imaging of the human brain with an analytic reception profile correction. JMRI 5, 139–144.

L.L. Wald, L. Carvajal, S.E. Moyher, S.J. Nelson, P.E. Grant, A.J. Barkovich, D.B. Vigeron (1995) Phased array detectors and an automated intensity correction algorithm for high resolution MR imaging of the human brain. (JMRI (in press).

*Primary Examiner*—David K. Moore
*Assistant Examiner*—Wenpeng Chen
*Attorney, Agent, or Firm*—James O. Skarsten; Christian G. Cabou; Phyllis Y. Price

[57] ABSTRACT

A method is provided for correcting an imaging function g acquired by and MR surface coil having associated spatial inhomogeneity, the function g defining an image comprising a matrix array having a specified number of pixels, and being directed to specified structure within an imaging subject. A shrinking operation is applied to the function g to generate the function $g_{shrunk}$ comprising an array having a number of pixels equal to the specified number, as reduced by a shrink parameter with respect to each edge of the g function array. Pixels of the function $g_{shrunk}$ are compared with a threshold value to produce a thresholded function THRESH[g]$_{shrunk}$ and a low pass filtering operation is applied to both $g_{shrunk}$ and THRESH[g]$_{shrunk}$ to generate filtered shrunk and filtered thresholded functions, respectively. A first function representing the filtered shrunk function is divided by a second function representing the filtered thresholded function to produce a distortion function $h_{shrunk}$. The function $h_{shrunk}$ is expanded to provide a distortion function h, representing a profile of the spatial inhomogeneity. Acquired function g and the computed distortion function h are used to provide a corrected function $f$, representing an image of the specified structure from which effects of the inhomogeneity have been substantially reduced.

17 Claims, 3 Drawing Sheets

METHOD FOR CORRECTING INHOMOGENEITY OF SPATIAL INTENSITY IN AN AQUIRED MR IMAGE

BACKGROUND OF THE INVENTION

The invention disclosed and claimed herein is generally directed to a method for correcting spatial inhomogeneity or nonuniformity of spatial intensity in an acquired magnetic resonance (MR) or other medical diagnostic image. More particularly, the invention is directed to a correction method of such type wherein the primary component of inhomogeneity is slowly varying.

In many areas of imaging including MR and computed tomography, acquired images are corrupted by slowly varying multiplicative inhomogeneities or nonuniformities in spatial intensity. Such nonuniformities can hinder visualization of the entire image at a given time, and can also hinder automated image analysis. Such inhomogeneity is a particular concern in MR when single or multiple surface coils are used to acquire imaging data. The acquired images generally contain intensity variations resulting from the inhomogeneous sensitivity profiles of the surface coil or coils. In general, tissue next to the surface coil appears much brighter than tissue far from the coil. Spatial intensity variations introduced by surface coil nonuniformity hinders visualization because one cannot find a window/level adjustment to encompass the entire field of view. When such images are filmed, the operator tries to select a setting which covers most of the features of interest. Furthermore, uncorrected image inhomogeneity makes it difficult to perform image segmentation and other aspects of image analysis.

An example of the problem is spine imaging, wherein one or more surface coils are placed behind a patient. If the central spinal canal is filmed optimally, tissue structure behind the vertebral column may be overamplified and may become so bright that no tissue detail can be seen. At the same time, tissue in front of the vertebral column may be so dark that image detail in that area is also obscured. Therefore, in order to optimally display and film the entire image, the signal variation due to the inhomogeneous sensitivity profile of the surface coil needs to be corrected. Surface coil image signal intensities generally represent the product of (1) precessing magnetization of the body tissue or other object being imaged, and (2) the sensitivity profile of the surface coil. Accordingly, various intensity correction algorithms have been devised to correct surface coil images by dividing out an estimate of the surface coil's sensitivity profile. Thus, if the observed or acquired MR image signal is defined in a spatial domain for a voxel location (x,y,z) by the function g(x,y,z) then g(x,y,z)=h(x,y,z)*f(x,y,z)+n(x,y,z), where * represents multiplication, h,f, and n represent the coil profile function, a corrected function, and the imaging noise, respectively. More specifically, the corrected function $f$ is a function defining an image which is substantially free of distortion resulting from the inhomogeneity. Thus, the problem is to determine both h and $f$, given only the measured or acquired function g in the presence of n. However, if the function h can be determined which reasonably represents the inhomogeneity distortion, then $f$ can be readily computed from $$f = \frac{g*h}{h*h+\Psi_1},$$

which is known in the art as Weiner filter solution, where $\Psi_1$ is a regularization parameter corresponding to the reciprocal of signal to noise ratio. Herein, and in the following discussion, location indices (x,y,z) have been dropped for the sake of brevity.

The distortion arising from use of surface coils generally varies slowly over space. An important class of prior art solutions to the above problem is based on this assumption. In accordance therewith, a low pass filtering operation is applied to g. The resulting function, represented as LPF[g], does not contain high frequency components and is taken as an estimate of distortion function h. An estimate of $f$ is then obtained by dividing g by LPF[g], i.e., $f$=g/LPF[g]. However, for this class of methods to be effective, g must not contain sharp intensity transitions. Unfortunately, in MR imaging an air-lipid interface usually contains sharp intensity transitions which violate the basic assumption made in the method, i.e., that the low frequency content in the scene being imaged is solely due to h. Significant air-lipid interferences will generally be encountered, for example, at the edges of an organ, i.e., at the boundary between the organ and an air-space or cavity.

To overcome the above deficiency in low pass filtering correction at the edge or boundary of an organ or other tissue structure, certain hybrid filtering techniques have been developed. Some of such techniques are set forth in the following references: Surface Coil MR Imaging of the Human Brain with an Analytic Reception Profile Correction, JMRI 5, 139–144, by S. E. Moyher, D. B. Vigeron, and S. J. Nelson; Phased Array Detectors and an Automated Intensity Correction Algorithm for High Resolution MR Imaging of the Human Brain, JMRI (1995), by L L. Wald, L. Carvajal, S. E. Moyher, S. J. Nelson, P. E. Grant, A. J. Barkovich, and D. B. Vingeron; and Phased Array Image Intensity Correction: An Algorithm to Remove Intensity Variations in MR Images Resulting from the Inhomogeneous Sensitivity Profiles of Phased Array Surface Coils, a Master's thesis by J. Murakami (1995), University of Washington, Seattle.

In a further reference, entitled Intensity Correction of Phased-Array Surface Coil Images, MRM 35:585–590 (1996), by Murakami et al, a technique is disclosed wherein the distortion function h is set to h=LPF[g]/LPF[THRESH [g]]. THRESH [g] is a thresholded or threshold operation, wherein intensity values of respective pixels of the acquired function g are compared with a threshold value set at a noise level. Intensity values above the noise level are assigned a level equal to the average intensity of the image, and the remaining intensity values are set to zero.

The thresholding operation has the effect of smoothing the distortion function h at the boundaries or edge regions of organs and other tissue structures, which result from the substantial intensity transitions occurring at such regions. This is because THRESH[g] will be greater at such regions, and accordingly will reduce LPF [g]. However, neither the technique of Murakami nor other hybrid filtering techniques is particularly effective in accounting for significant internal transitions, i.e., transitions which occur between the edges of an organ or other tissue structure. Moreover, such internal transitions are determined by the tissue of a particular patient, rather than by the parameters of the MR equipment. Accordingly, it would be very desirable to develop a form for a distortion function h which is substantially unaffected by the tissue structure of a particular patient, and by abrupt transitions occurring therein. Furthermore, it would be desirable to speed up the computations without sacrificing accuracy.

SUMMARY OF THE INVENTION

The present invention provides a method for correcting an imaging function acquired by an MR system, wherein the system has associated spatial inhomogeneity, and the acquired function defines an image, comprising a matrix array having a specified number of pixels, of specified structure within an imaging subject. In the most general case the array comprises a three-dimensional array. The method includes the step of applying a shrinking operation to the acquired function to generate a shrunk function $g_{shrunk}$ defining an image of the specified structure. The $g_{shrunk}$ array has a number of pixels equal to the specified number, as reduced by a selected factor or shrink parameter S with respect to each dimension of the acquired function array. For a three-dimensional array, the shrink parameters may be represented as $S_1$, $S_2$, and $S_3$ in relation to X-, Y-, and Z-reference axes, respectively.

Respective pixels of the shrunk function are weighted in accordance with a threshold value to produce a thresholded function THRESH[$g_{shrunk}$]. A low pass filtering operation is applied to the shrunk function and the thresholded function to provide filtered shrunk and filtered thresholded functions respectively, and a first function representing the filtered shrunk function is divided by a second function representing the filtered thresholded function to produce a shrunk-form distortion function $h_{shrunk}$. Finally, the shrunk-form distortion function is expanded to provide a function h representing the profile of the spatial inhomogeneity, the distortion function being associated with an array comprising a number of pixels equal to the above specified number. The acquired function g is then multiplied by Weiner filter formed $$\left(\frac{h}{h*h+\Psi_1}\right)$$

on a pixel by pixel basis, to provide corrected function $f$ defining an image of the specified structure from which effects of the inhomogeneity have been substantially removed.

It is to be understood that an $S_1 \times S_2 \times S_3$ submatrix array of pixels associated with the acquired function g corresponds to each pixel of the array associated with the shrunk function $g_{shrunk}$. As part of the shrinking operation, the intensity value of each pixel of the $g_{shrunk}$ array is set to the average intensity value of its corresponding pixels from the acquired array. This has the effect of eliminating local variations or transitions within the interior of the tissue structure or other object being imaged. Substantially varying intensity values at regions of abrupt transition are replaced by the average value of pixels located around the neighborhood of the transition.

Moreover, by performing most of the operations of the above correction method on a shrunk function array of substantially reduced pixel size, the operations can be carried out with substantial rapidity in comparison with the array of acquired function g without sacrificing accuracy of the final result.

In a preferred embodiment, the first and second functions respectively representing the filtered shrunk function and filtered thresholded function, are derived by maximizing operation, described hereinafter. This operation has the effect of enhancing numerical stability and suppressing amplification of noise. An embodiment of the invention, described hereinafter in further detail, can produce MR images with greater accuracy than certain prior art correction techniques, and yet requires only one fiftieth of the imaging time.

OBJECTS OF THE INVENTION

An object of the invention is to provide an improved method for estimating the intensity profile of an MR surface coil for use in generating a distortion correction function.

Another object is to provide a method of the above type which is independent of local transitions or variations within an organ or other tissue structure through which an MR image is taken.

A third object is to provide a method of the above type wherein speed of computation is substantially improved by using reduced data sets, without compromising the accuracy of the final result.

These and other objects of the invention will become more readily apparent from the ensuing specification, taken together with the accompanying drawings.

DETAILED DESCRIPTION OF THE PREFERRED EMBODIMENT

Figure 1:
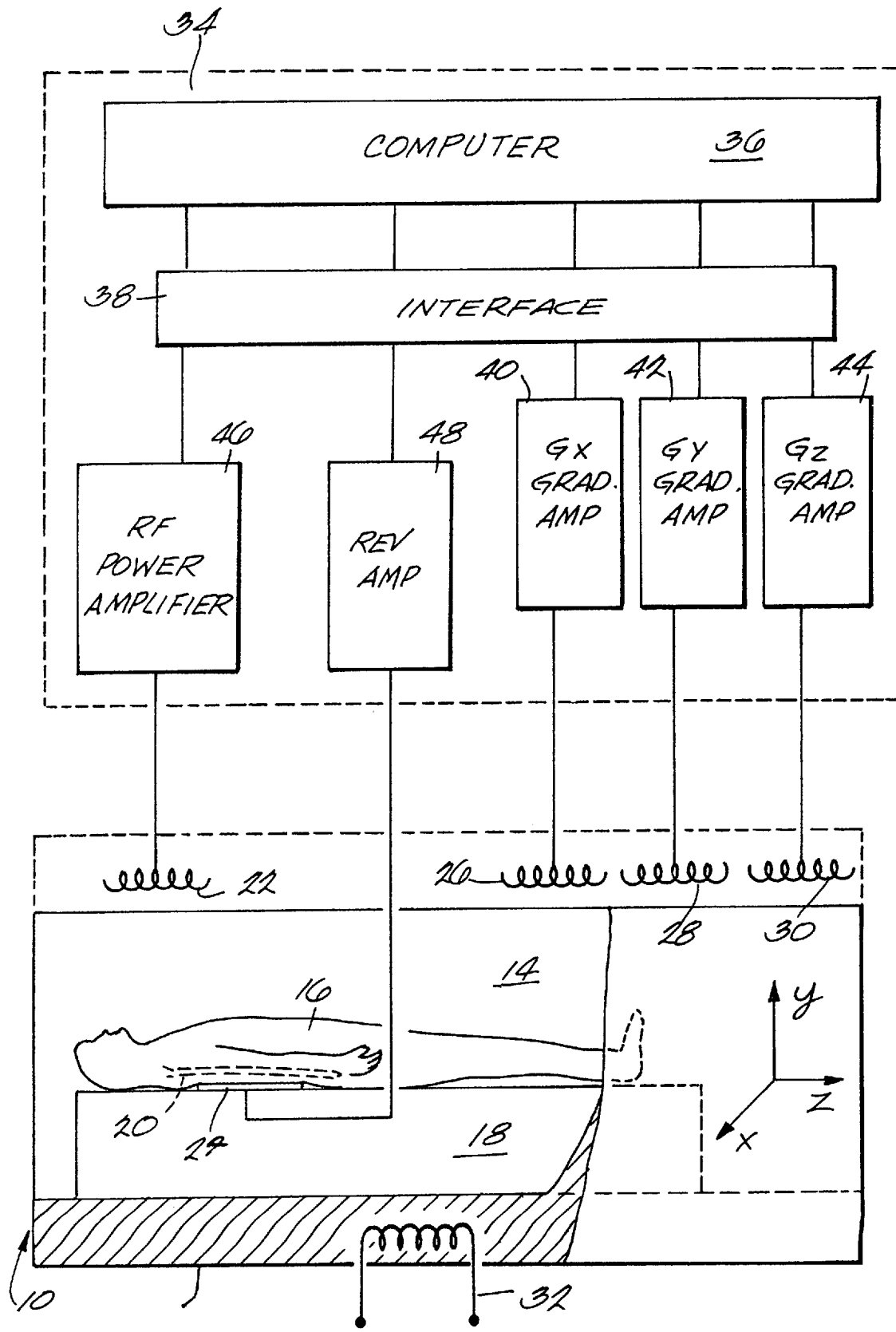
FIG. 1 is a block diagram showing an MR system in simplified form for use in implementing an embodiment of the invention.

Referring to FIG. 1, there are shown principal components of an MR imaging system 10, which may be used to acquire a set of MR data signals. System 10 includes a main magnet 12 provided with a bore 14. A patient or imaging subject 16 is positioned on a padded table or other patient support structure 18 in the bore 14, so that an MR image can be obtained of an organ or other specified tissue structure of patient 16, such as the patient's spinal column 20. MR system 10 further includes an RF excitation coil 22, surface coil 24, X-, Y-, Z-gradient coils 26, 28, and 30, respectively, and a static main magnet coil 32. All of the coils 22 and 26–30 are incorporated into magnet 12, and are energized to project respective magnetic fields into bore 14, and to thereby generate MR data signals within the region of interest in patient 16. Surface coil 24 is positioned in close relationship with the spine or other portion of patient 16, to detect or acquire the MR data signals representing the desired image.

MR system 10 additionally comprises a system electronics package 34, which includes a computer 36 interactively coupled to an interface 38, and gradient amplifiers 40, 42, and 44. The gradient amplifiers are each coupled to computer 36 through interface 38, to respectively energize gradient coils 26, 28, and 30. The electronics package 34 further includes an RF power amplifier 46, coupled to energize coil 22 to produce RF excitation pulses, and receive amplifier 48 for amplifying MR data signals detected by surface coil 24. It is to be understood that system electronics 34 is likely to include other components which are not shown for purposes of simplification. FIG. 1 also shows rectangular coordinate X-, Y-, and Z-axes which are in mutually orthogonal relationship with one another, the Z-axis being directed along the axis of bore 14.

Computer 36 performs data processing functions with respect to MR data signals to provide an image of the specified structure comprising a matrix array of pixels. Each pixel has an intensity value defined by the function g (x,y,z), as described above. Computer 36 may also be employed to process acquired MR data and to perform the inhomogeneity correction method with respect to g (x,y,z), in accordance with an embodiment of the invention, as described hereinafter in further detail.

Figure 2:
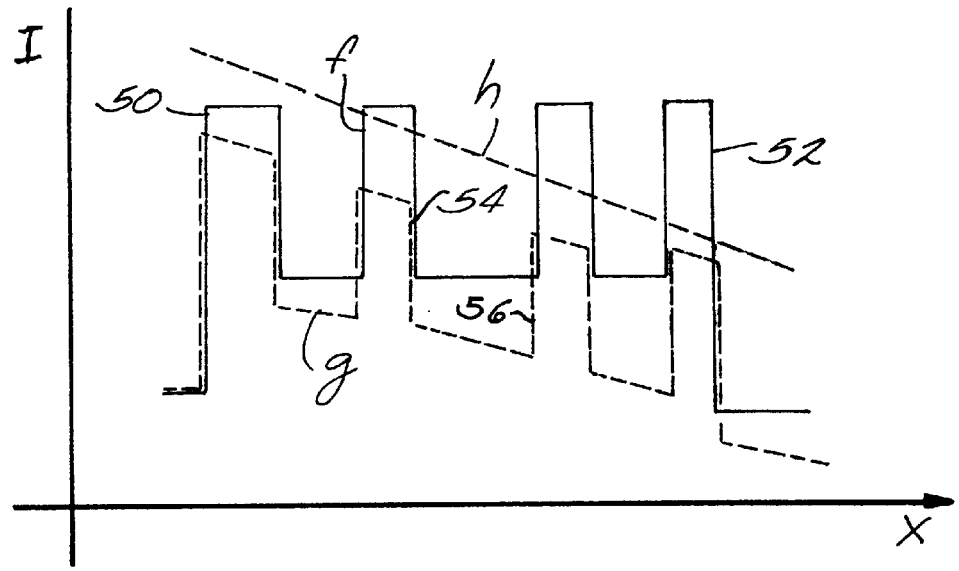
FIG. 2 is a curve depicting intensity variations or transitions within imaged structure.

Referring to FIG. 2, there is shown a plot of the signal strength or intensity I of the acquired MR image function g(x,y,z), with respect to the X-axis for simplicity. Portions of the function g represent intensity transitions 50 and 52. These transitions result from the air-lipid interface at the edges of an organ or other tissue structure within the patient 16, which is under study. Within the structure, i.e., between the edges 50 and 52 thereof, local or interior transitions such as 54 and 56 occur, which are specific to patient 16. It is desired to provide a function h which varies slowly over space, that is, without abrupt transitions.

Figure 3:
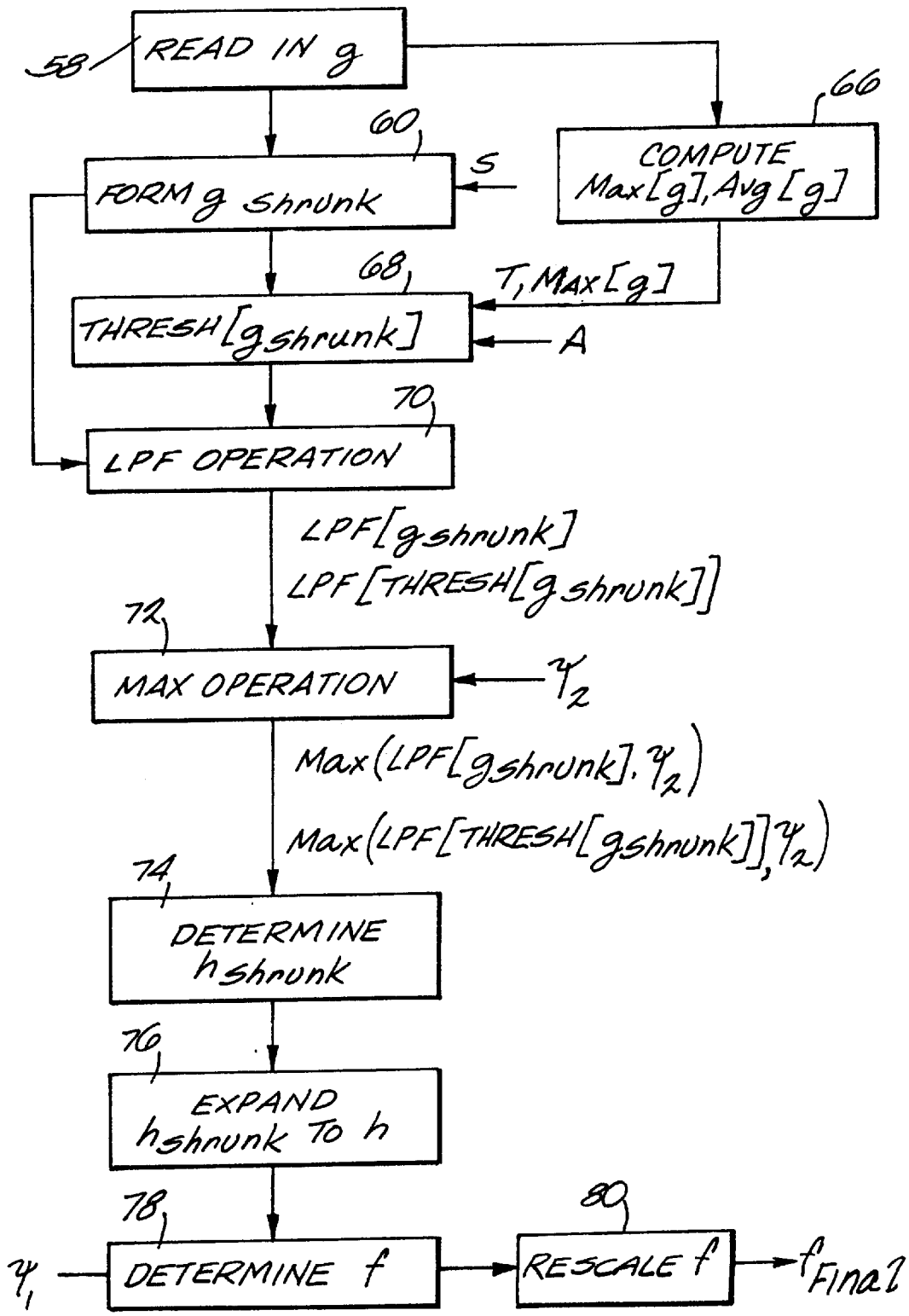
FIG. 3 is a diagram showing respective steps of a simplified embodiment of the invention.

Referring to FIG. 3, there is shown process block 58 which receives the acquired image function g (x,y,z) to commence the correction method. Process block 60 represents a shrink operation applied to the matrix array of pixels defined by function g, to provide a shrunk function $g_{shrunk}$. In accordance with such operation, the pixel array of g is reduced along each edge by a shrink parameter. For a three-dimensional array, the pixel array would be reduced by shrink parameters $S_1$, $S_2$, and $S_3$ along edges respectively parallel to the X-, Y,- and Z-axes. For the special two-dimensional case of an array in the X-Y plane, $S_1$ and $S_2$ may equal a common shrink parameter S, and $g_{shrunk}$ usefully represents a 32×32 pixel array. For example, if g represents a 256×256 pixel array, then S=256/32=8.

It will be understood that if an imaging slice is taken along the Z-direction, shrink parameter $S_3$ will be selected so that the pixel dimension of $g_{shrunk}$ along the Z-dimension will be somewhat less than the pixel dimensions for the X- or Y-directions. It will be understood further that each pixel of $g_{shrunk}$ has an intensity equal to the average intensity of a corresponding $S_1 \times S_2 \times S_3$ submatrix of pixels of the g function array.

Figure 4:
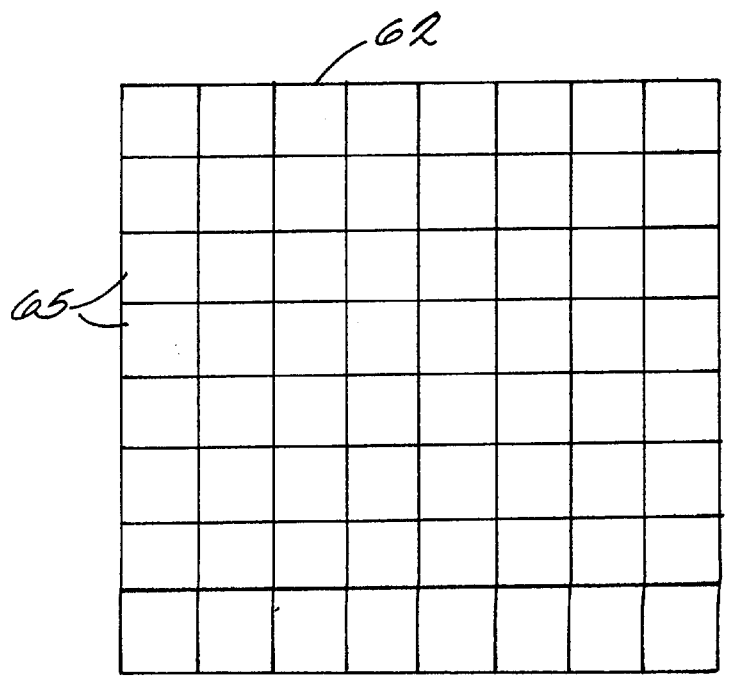
FIG. 4 is a diagram illustrating the shrinking operation of the embodiment of FIG. 3.

Referring to FIG. 4, there is shown one of the pixels 62 defined by $g_{shrunk}$, for the two-dimensional case where S=8. Pixel 62 comprises an 8×8 submatrix of pixels 65, from the matrix defined by the acquired function g. As part of the shrink operation, each pixel 62 is given an intensity value equal to the average intensity of its constituent pixels 65.

Referring further to FIG. 3, there is shown a process block 66 representing an operation to determine Max[g], the maximum value of acquired function g and Avg[g], the average value thereof. Max[g] is employed to compute a threshold T, for the threshold operation represented by process block 68, where T=$T_1$ Max[g]. $T_1$ is usefully selected to be 0.025. However, it may be set slightly higher for noisier images, and lower for less noisy images. In the threshold operation, the intensity of respective pixels of $g_{shrunk}$ are compared with the threshold T. If intensity is less than or equal to T, the pixel is assigned the value of zero. Otherwise, it is assigned a value A*Avg[g], where A is usefully selected to be 0.01. The result of the threshold operation function is referred to as THRESH[$g_{shrunk}$].

Process block 70 represents low pass filtering of $g_{shrunk}$, to provide functions LPF[$g_{shrunk}$] and LPF[THRESH[$g_{shrunk}$]], respectively. Such functions have higher frequency components associated with sharp intensity transitions removed therefrom. The LPF operation commences by taking a transform of $g_{shrunk}$ and THRESH[$g_{shrunk}$], such as a Discrete Cosine Transform (DCT). Respective transform components are then multiplied by coefficients predetermined in accordance with a Gausian filter operation. Such filter operation, which provides a pass band having the shape of a Gausian curve of selected variance, is considered to be well-known in the art. The inverse FFT are then computed for respective coefficient multiplications, to determine LPF [$g_{shrunk}$] and LPF[THRESH [$g_{shrunk}$]], which are applied to process block 72. Consistent with the invention, other transforms or other techniques, which will readily occur to those of skill in the art, may be employed to low pass filter $g_{shrunk}$ and THRESH [$g_{shrunk}$]. For example, a Fast Fourier Transform may be used.

Process block 72 is directed to a maximizing operation, wherein respective pixel intensities of the two filtered functions are compared with a small regularization parameter $\psi_2$. Usefully, $\psi_2$=0.0001. The compared pixel intensity is either kept, if it is greater than $\psi_2$, or else set to the value $\psi_2$ if $\psi_2$ is greater. The results of the maximizing operation are referred to as Max (LPF[$g_{shrunk}$], $\psi_2$) and Max (LPF [THRESH [$g_{shrunk}$]], $\psi_2$). Such operation improves numerical stability in subsequent operations, by eliminating division by very small or near-zero numbers. This, in turn, avoids noise amplification.

Referring to process block 74 of FIG. 3, a shrunken form of the distortion function can be determined from the results of the maximizing operation in accordance with the following relationship:

$$h_{shrunk} = \text{Max}(\text{LPF}[g_{shrunk}], \psi_2)/\text{Max}(\text{LPF}[\text{THRESH}[g_{shrunk}]], \psi_2) \quad \text{Equation (1)}$$

As indicated by process block 76, $h_{shrunk}$ can be expanded to provide the distortion function h, comprising the original array. $h_{shrunk}$ can be expanded, for example, by means of a process known in the art as trilinear interpolation, for a three-dimensional array or bilinear interpolation could be used for a two-dimensional array. Such a process is described, for example, in Numerical Recipes in C, The Art of Scientific Computing, by William H. Press, Brian P. Flannery, Saul A. Tenkolsy, and William T. Vetterling; Cambridge University Press (1988). Given distortion function h, the corrected function $f$ can be readily determined, as indicated by process block 78, from the following relationship, accounting for noise:

$$f = g*h/(h*h+\psi_1) \quad \text{Equation (2)}$$

In Equation 2, $\psi_1$ is a regularization parameter derived from the reciprocal of the signal-to-noise ratio.

It will be seen that the intensity range of $f$ is reduced from the original intensity range of g, as a result of the division shown in Equation (2). Accordingly, it is necessary to rescale the function $f$ back to the original intensity range, as illustrated by process block 80, to provide a corrected function in final form $f_{final}$. This is achieved by means of the following relation:

$$f_{final} = (f-\text{Min}[f])*\text{Max}[g]/(\text{Max}[f]-\text{Min}[f]), \text{ inside a prespecified region of interest} =0, \text{ outside the region} \quad \text{Equation (3)}$$

In Equation (3), Min [$f$] and Max[$f$] are the minimum and maximum values of $f$, respectively.

Obviously, numerous other modifications and variations of the present invention are possible in light of the above teachings. It is therefore to be understood that within the scope of the disclosed concept, the invention may be practiced otherwise than as specifically described.

What is claimed is:

1. A method for correcting an imaging function acquired by an MR system which includes a number of surface coils, wherein said system has associated spatial inhomogeneity, and said acquired function defines an image of specified structure, the image comprising a matrix array of a specified number of pixels, and said method comprising the steps of:

employing one or more of said surface coils to acquire said MR imaging function;

applying a shrink operation to said acquired function to generate a shrunk function defining an image of said structure which comprises a matrix array having a number of pixels equal to said specified number, as reduced by a selected shrink parameter along each dimension of said array;

thresholding respective pixels of said shrunk function in accordance with a threshold value to produce a thresholded function;

low pass filtering said shrunk function and said thresholded function to provide filtered shrunk and filtered thresholded functions, respectively;

generating first and second functions from said filtered shrunk function and from said filtered thresholded function, respectively by identifying each pixel value of said filtered shrunk function and of said filtered thresholded function which is less than a specified regularization parameter, and substituting said regularization parameter for each of said identified pixel values;

dividing said first function by said second function to produce a distortion function in shrunk form; and expanding said shrunken-form distortion function to provide a distortion function representing the profile of said spatial inhomogeneity.

2. The method of claim 1 wherein:

said method includes the step of multiplying said acquired function by a Weiner filter function derived from said distortion function to provide a corrected function which defines an image of said specified structure from which effects of said spatial inhomogeneity have been substantially removed.

3. The method of claim 2 wherein:

a number of pixels of said acquired function correspond to each pixel of said shrunk function, said number of corresponding pixels being determined by said selected shrink parameters, each pixel of said shrunk function having an intensity comprising the average intensity of its corresponding pixels.

4. The method of claim 3 wherein:

said selected shrink parameters comprise parameter values $S_1$, $S_2$, and $S_3$, respectively corresponding to dimensions of said array directed along X-, Y-, and Z-axes, an $S_1 \times S_2 \times S_3$, a submatrix array of pixels of said acquired function corresponding to each pixel of said shrunk function.

5. The method of claim 1 wherein:

said first and second functions comprise functions generated from said filtered shrunk function and said filtered thresholded function, respectively, to enhance numerical stability and to thereby suppress amplification of noise in said dividing step of said method.

6. The method of claim 5 wherein:

said thresholding step of said method comprises setting all pixel values of said shrunk function which are equal to or less than said threshold value to zero, and setting the remaining pixel values thereof to a value representing the average intensity of all pixel values of said shrunk function.

7. The method of claim 6 wherein:

said array comprises a three-dimensional array, and said expanding step comprises a trilinear interpolation process.

8. The method of claim 6 wherein:

said array comprises a two-dimensional array, and said expanding step comprises a bilinear interpolation process.

9. The method of claim 6 wherein:

said filtering step comprises a Gausian filtering operation.

10. The method of claim 2 wherein:

the intensity range of said corrected function which defines said image from which inhomogeneity effects have been substantially removed is re-scaled to the original intensity range of said acquired function.

11. A method for correcting spatial inhomogeneity in an image acquired by an MR system which includes a number of surface coils, said method comprising the steps of:

employing one or more of said surface coils, together with other components of said MR system, to acquire a function defining an image of specified structure comprising a matrix array having a specified number of pixels;

applying a shrink operation to said acquired function to generate a shrunk function defining an image comprising a matrix array of pixels, each pixel of said shrunk function corresponding to a submatrix of pixels of said acquired function, and each pixel of said shrunk function having an intensity comprising the average intensity of the pixels of its corresponding submatrix;

thresholding respective pixels of said shrunk function in accordance with a threshold value to produce a thresholded function;

low pass filtering said shrunk function and said thresholded function to provide filtered shrunk and filtered thresholded functions, respectively;

dividing a first function representing said filtered shrunk function by a second function representing said filtered thresholded function to produce a distortion function in shrunk form; and expanding said shrunk-form distortion function to provide a distortion function representing the profile of said spatial inhomogeneity.

12. The method of claim 11 wherein:

said method includes the step of multiplying said acquired function by a Weiner filter function derived from said distortion function to provide a corrected function which defines an image of said specified structure from which effects of said spatial inhomogeneity have been substantially removed.

13. The method of claim 11 wherein:

said shrunk function matrix array comprises a number of pixels equal to said specified number, as reduced by a selected shrink parameter along each dimension of said shrunk function array.

14. The method of claim 13 wherein:

said selected shrink parameters comprise parameter values $S_1$, $S_2$, and $S_3$, which respectively correspond to dimensions of said array directed along X-, Y-, and Z-axes.

15. The method of claim 11 wherein:

said first and second functions comprise functions generated from said filtered shrunk function and said filtered thresholded function, respectively, to enhance numerical stability and to thereby suppress amplification of noise in said dividing step of said method.

16. The method of claim 11 wherein:

said first and second functions are respectively generated by identifying each pixel value of said filtered shrunk function and said filtered thresholded function which is less than a specified regularization parameter, and substituting said regularization parameter for each of said identified pixel values.

17. The method of claim 11 wherein:

said thresholding step of said method comprises setting all pixel values of said shrunk function which are equal to or less than said threshold value to zero, and setting the remaining pixel values thereof to a value representing the average intensity of all pixel values of said shrunk function.

* * * * *